(12) United States Patent
Kuroda

(10) Patent No.: US 12,656,389 B2
(45) Date of Patent: Jun. 16, 2026

(54) PROCESSING SYSTEM, MANAGEMENT DEVICE, AND LOG ACQUISITION METHOD

(71) Applicant: Tokyo Electron Limited, Tokyo (JP)

(72) Inventor: Miyoko Kuroda, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 408 days.

(21) Appl. No.: 18/560,530

(22) PCT Filed: May 19, 2022

(86) PCT No.: PCT/JP2022/020866
§ 371 (c)(1),
(2) Date: Nov. 13, 2023

(87) PCT Pub. No.: WO2022/249974
PCT Pub. Date: Dec. 1, 2022

(65) Prior Publication Data
US 2024/0255561 A1 Aug. 1, 2024

(30) Foreign Application Priority Data
May 25, 2021 (JP) ................................. 2021-087885

(51) Int. Cl.
*G01R 31/26* (2020.01)
*G01R 31/28* (2006.01)
(52) U.S. Cl.
CPC ......... *G01R 31/26* (2013.01); *G01R 31/2868* (2013.01)
(58) Field of Classification Search
CPC ..... G01R 31/26; G01R 31/2868; H10P 95/00; H10P 74/00; G05B 19/418; G06F 21/44

USPC .............................. 705/1.1–912; 324/750.01
See application file for complete search history.

(56) References Cited

U.S. PATENT DOCUMENTS

2012/0167203 A1 6/2012 Lee et al.

FOREIGN PATENT DOCUMENTS

| | | |
|---|---|---|
| JP | 2013-025515 | 2/2013 |
| JP | 2014-22552 | 2/2014 |
| KR | 10-2012-0071022 | 7/2012 |
| KR | 10-2019-0117775 | 10/2019 |

*Primary Examiner* — Jonathan P Ouellette
(74) *Attorney, Agent, or Firm* — IPUSA, PLLC

(57) ABSTRACT

The processing system includes multiple testers configured to test a semiconductor device, and a management device connected to be capable of performing information communication with the multiple testers. The multiple testers are arranged in a height direction in two or more levels and each of the multiple testers includes a tester-side storage unit configured to store log information related to a state of the tester. The management device collectively outputs a request command for requesting log information to one or more selected testers determined by selecting all the multiple testers or some of the multiple testers, and acquires the log information from the selected tester that has received the request command. The management device acquires the log information when an authenticating unit determines that tester-side identification information matches management identification information, and disables acquisition of the log information to the management device when the authenticating unit determines that the tester-side identification information does not match the management identification information.

10 Claims, 13 Drawing Sheets

FIG.13

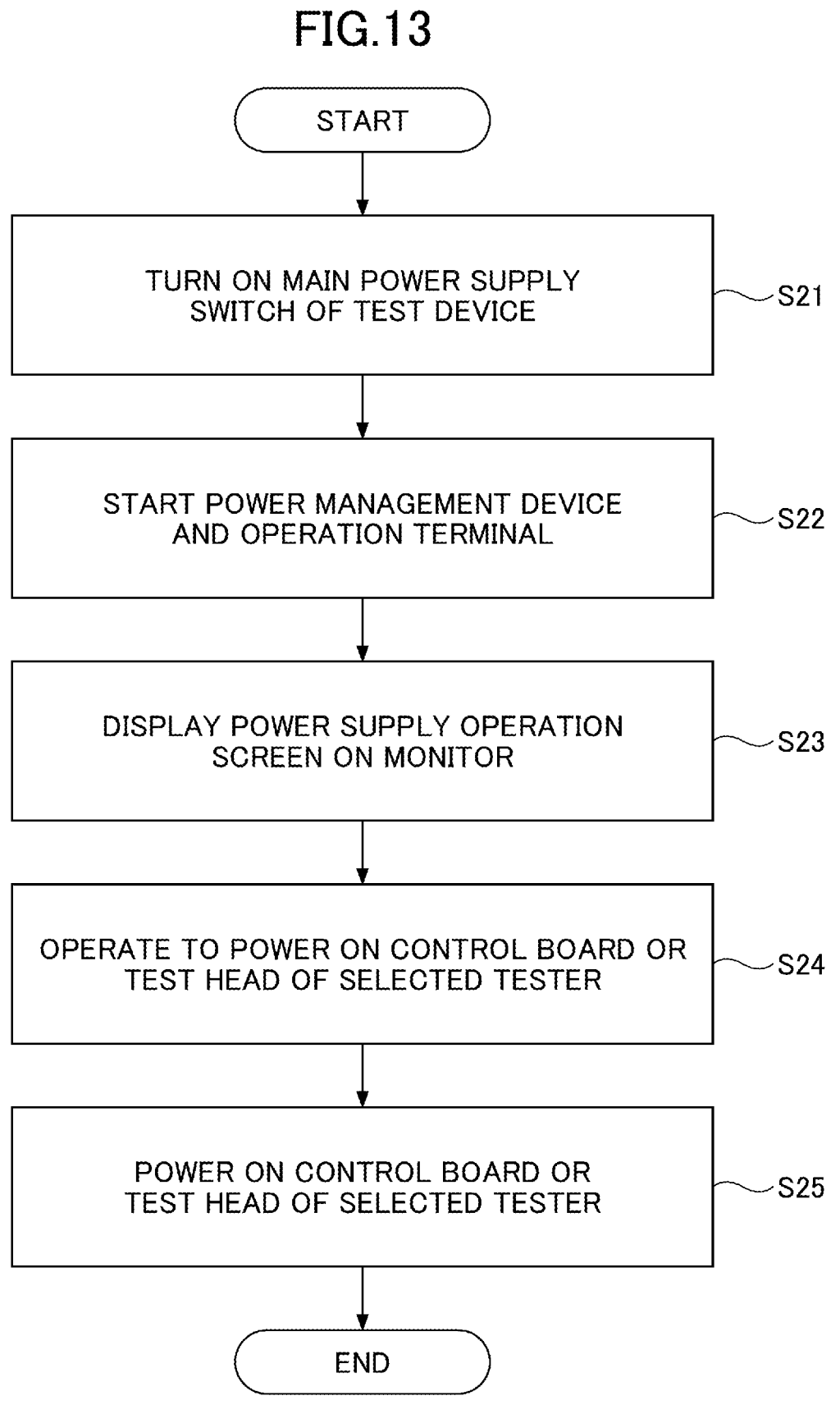

START

↓

TURN ON MAIN POWER SUPPLY
SWITCH OF TEST DEVICE — S21

↓

START POWER MANAGEMENT DEVICE
AND OPERATION TERMINAL — S22

↓

DISPLAY POWER SUPPLY OPERATION
SCREEN ON MONITOR — S23

↓

OPERATE TO POWER ON CONTROL BOARD OR
TEST HEAD OF SELECTED TESTER — S24

↓

POWER ON CONTROL BOARD OR
TEST HEAD OF SELECTED TESTER — S25

↓

END

PROCESSING SYSTEM, MANAGEMENT DEVICE, AND LOG ACQUISITION METHOD

TECHNICAL FIELD

The present disclosure relates to a processing system, a management device, and a log acquisition method.

BACKGROUND

A test device including multiple testers that test semiconductor devices stores multiple types of log information (an event log, a diagnosis log, a system log, and the like) for each tester. For example, the log information is taken out from the tester by a user and used for troubleshooting, maintenance, and the like of the tester.

Patent Document 1 discloses a technique of storing, by connecting a USB memory (an external storage device) with a log acquisition command to the test device, a log to the USB memory from the storage unit of the test device.

RELATED ART DOCUMENT

Patent Document

Patent Document 1: Japanese Laid-open Patent Application Publication No. 2014-22552

SUMMARY OF THE INVENTION

Problem to be Solved by the Invention

The present disclosure provides a technique that can reduce a workload of log acquisition by safely acquiring log information of a selected tester.

Means for Solving Problem

According to one aspect of the present disclosure, a processing system including multiple testers configured to test a semiconductor device and a management device connected to be capable of performing information communication with the plurality of testers is provided. The multiple testers are arranged in a height direction in two or more levels and each of the multiple testers includes a tester-side storage unit configured to store log information related to a state of the tester. The management device includes a log request acquiring unit configured to collectively output a request command for requesting the log information to one or more selected testers determined by selecting all of the multiple testers or some of the multiple testers and acquire the log information from the selected tester that has received the request command. Either the multiple testers or the management device includes an authenticating unit configured to determine whether tester-side identification information included in the selected tester matches management identification information of the selected tester included in the management device. The management device acquires the log information when the authenticating unit of the selected tester that has received the request command or the authenticating unit of the management device determines that the tester-side identification information matches the management identification information, and disables acquisition of the log information to the management device when the authenticating unit of the selected tester that has received the request command or the authenticating unit of the management device determines that the tester-side identification information does not match the management identification information.

Effect of the Invention

According to the present disclosure, a workload of log acquisition can be reduced by safely acquiring log information of a selected tester.

BRIEF DESCRIPTION OF THE DRAWINGS

FIG. 13 is a flowchart illustrating an example of a method for operating a power supply of the test device.

DESCRIPTION OF EMBODIMENTS

Figure 1:
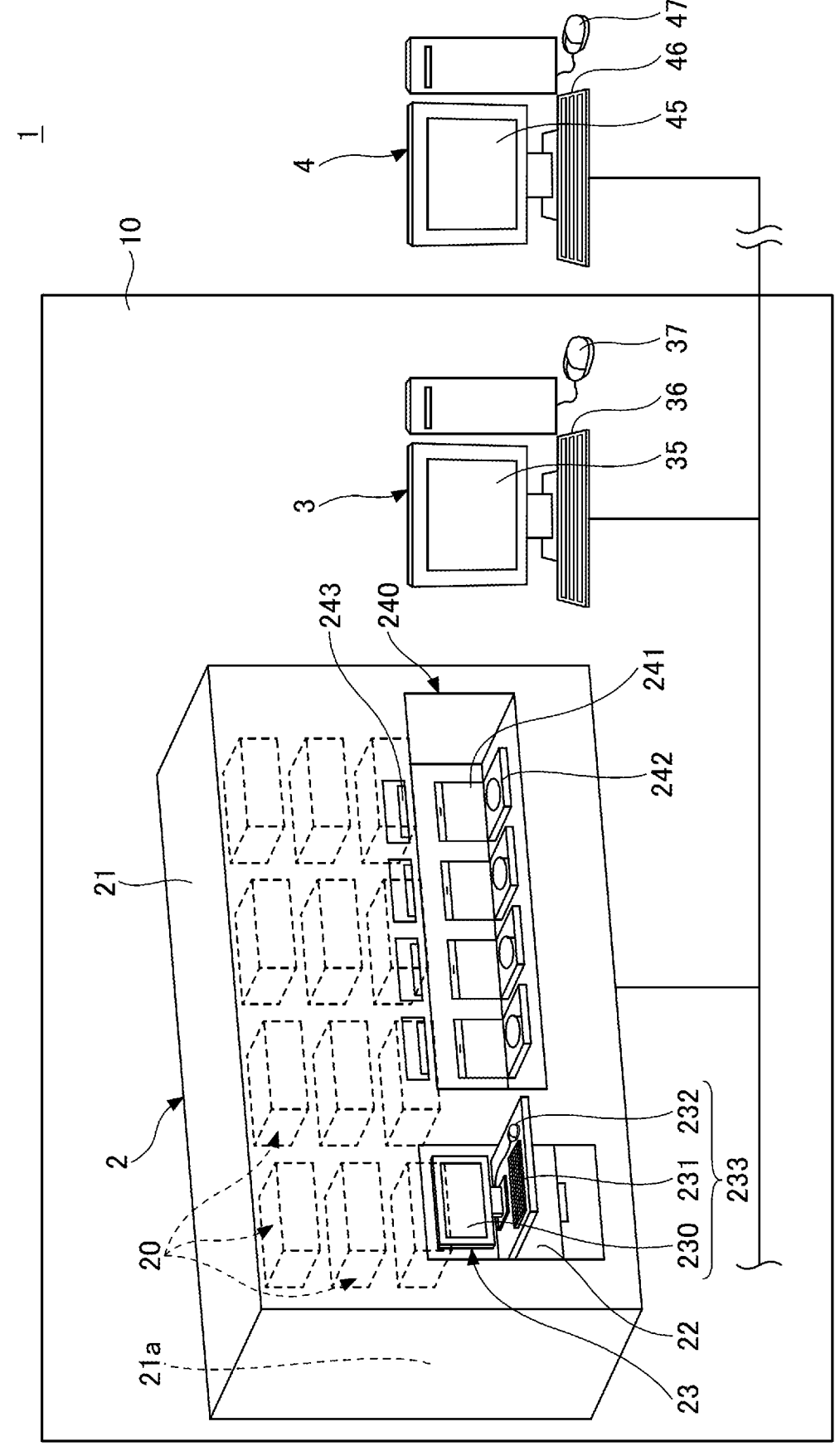
FIG. 1 is a schematic explanatory diagram illustrating an overall configuration of a processing system according to a first embodiment of the present disclosure.

In the following, embodiments of the present disclosure will be described with reference to the drawings. In the drawings, the same components are denoted by the same reference symbols, and duplicated description may be omitted.

First Embodiment

FIG. 1 is a schematic explanatory diagram illustrating an overall configuration of a processing system 1 according to a first embodiment of the present disclosure. As illustrated in FIG. 1, the processing system 1 according to the first embodiment includes a test device 2 and a management device 3 connected to be capable of performing information communication with the test device 2. Additionally, the processing system 1 includes one or more information processing terminals 4 connected to be capable of performing information communication with both (or one) of the test device 2 and the management device 3. Here, the information processing terminal 4 need not be connected to the processing system 1. The management device 3 may be disposed inside the test device 2 or may be disposed outside the test device 2.

The test device 2 includes multiple testers 20 that test semiconductor wafers (hereinafter referred to as wafers W: see FIG. 2), which is an example of a substrate. The test device 2 has a large housing 21 formed in a cuboid shape, and is disposed in a processing chamber 10 such as a clean room. A test chamber 21a for actually testing the wafer W is provided inside the housing 21. Additionally, the test device 2 includes a controller 22 that controls an operation of the test device 2 and an operation terminal 23 that is operated by a user of the test device 2 on the outer surface of the housing 21.

Figure 2:
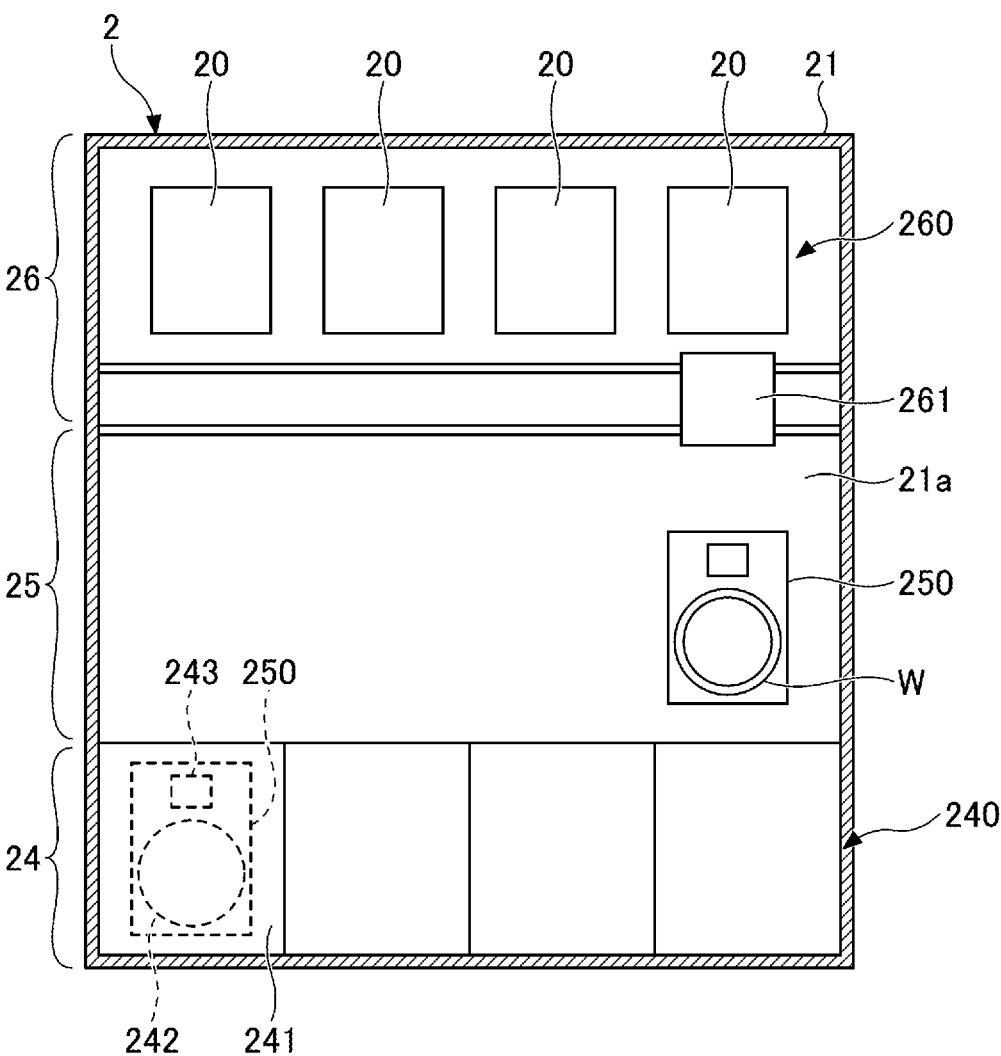
FIG. 2 is a schematic cross-sectional view along a horizontal direction of a test device.

FIG. 2 is a schematic cross-sectional view along a horizontal direction of the test device 2. As illustrated in FIG. 2, the test chamber 21a includes a carry-in/out region 24 for carrying the wafer W in/from the test chamber 21a, a transfer region 25 for transferring the wafer W carried from the carry-in/out region 24, and a test region 26 for testing the wafer W transferred from the transfer region 25.

The carry-in/out region 24 has multiple input/output sections 240 along the longitudinal direction of the housing 21 (see also FIG. 1). A load port 241, an aligner 242, a loader 243, and the like are provided in each input/output section 240. The load port 241 receives a FOUP, which is a container accommodating multiple wafers W. The aligner 242 aligns the wafers W. The loader 243 carries in and out the wafer W and a probe card, which is not illustrated.

The transfer region 25 includes a transfer stage 250 that is movable to the carry-in/out region 24 and the test region 26. One transfer stage 250 is provided for each tester line 260 in the test region 26, which is described later. The transfer stage 250 receives the wafer W from the load port 241 of the carry-in/out region 24, transfers the wafer W to the test region 26, and transfers the tested wafer W from the test region 26 to the load port 241.

Figure 3:
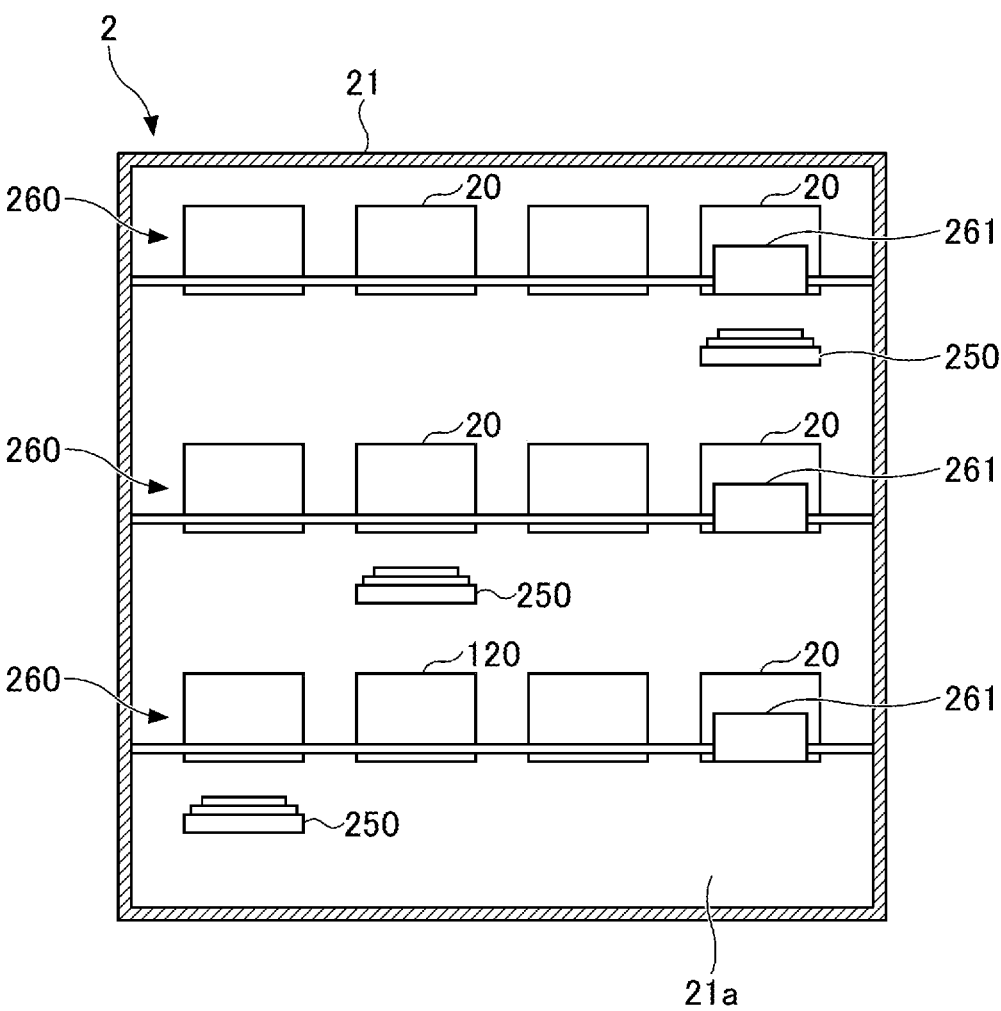
FIG. 3 is a schematic cross-sectional view along a vertical direction of a transfer region and a test region.

FIG. 3 is a schematic cross-sectional view along a vertical direction of the transfer region 25 and the test region 26. As illustrated in FIG. 3, the test region 26 has multiple testers 20 that test the wafers W. Specifically, the multiple testers 20 are arranged in a matrix in the horizontal direction (the longitudinal direction of the housing 21) and the vertical direction (the height direction). Hereinafter, the testers 20 arranged in the horizontal direction are referred to as the tester line 260. The tester line 260 according to the first embodiment has four testers 20 in the horizontal direction, and the test device 2 has three stages (multiple stages) of the tester lines 260 in the vertical direction. That is, the test device 2 includes twelve testers 20. Here, it is needless to say that the test device 2 is not particularly limited, with respect to the number of testers 20 constituting the tester line 260 and the number of stages of the tester lines 260.

Additionally, the test region 26 has one tester-side camera 261 for each of the multiple tester lines 260. Each tester-side camera 261 moves horizontally along the corresponding tester line 260, and images the position of the wafer W or the like transferred by the transfer stage 250 in front of respective testers 20 constituting the tester line 260.

The tester 20 includes a test head, which is not illustrated, to which a probe card is attached. The test head brings multiple contact probes (not illustrated) of the probe card into electrical contact with the semiconductor device (electrode pads, solder bumps, and the like) of the wafer W to test electrical characteristics of each semiconductor device of the wafer W.

Figure 4:
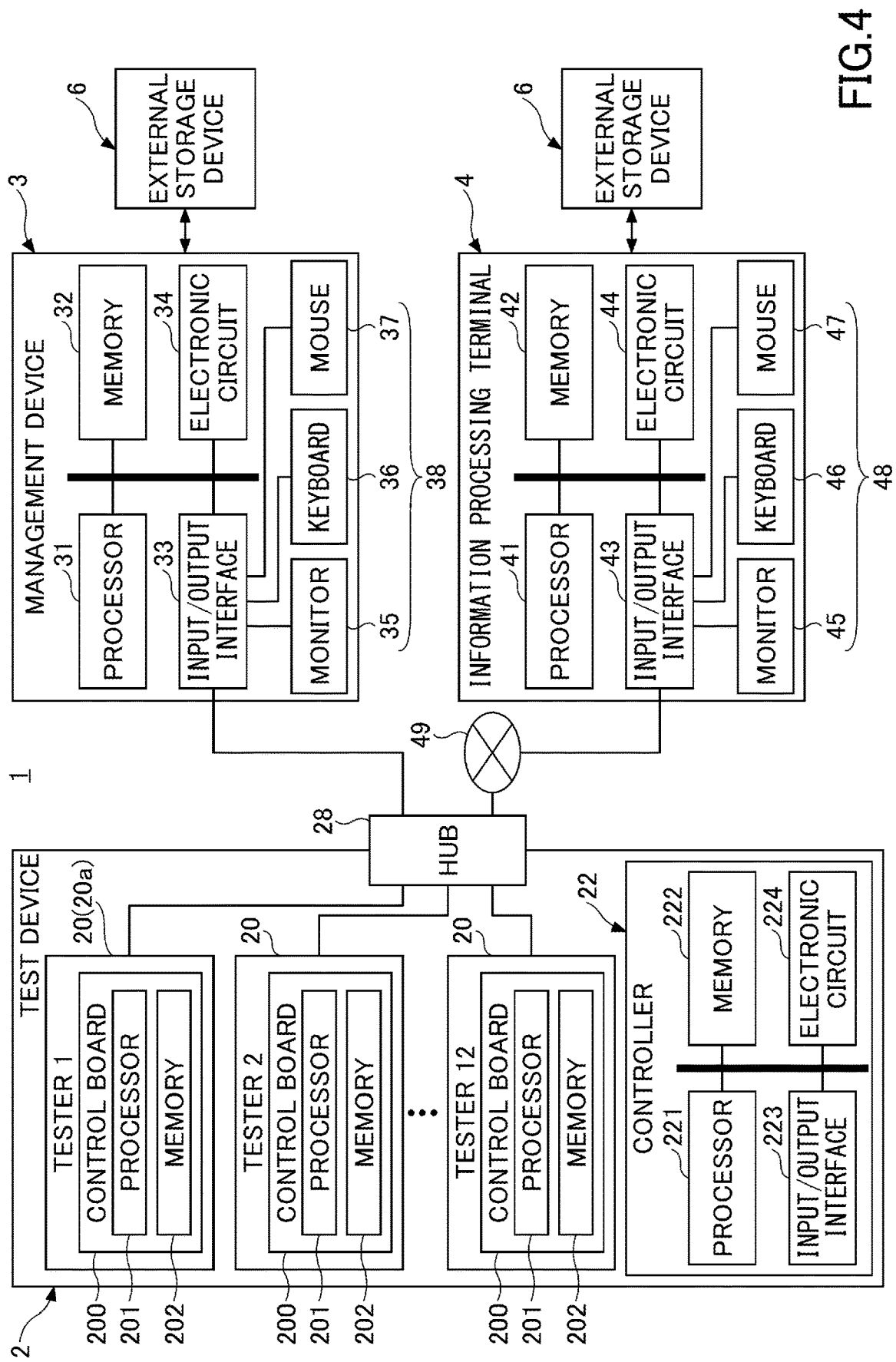
FIG. 4 is a block diagram illustrating hardware connections of the processing system.

FIG. 4 is a block diagram illustrating hardware connections of the processing system 1. As illustrated in FIG. 4, each of the multiple testers 20 includes a control board 200 for operating each component of the test head inside the tester 20. The control board 200 is a tester computer built-in board including one or more processors 201, a memory 202, an input/output interface, an electronic circuit, which are not illustrated, and the like. The processor 201 tests the wafer W by processing a control command transmitted from the controller 22 to operate the respective components, temporarily stores a test result, and transmits the test result of wafer W to the controller 22.

The one or more processors 201 of the control board 200 are one of or a combination of two or more of a CPU, a GPU, an ASIC, an FPGA, a circuit including multiple discrete semiconductors, and the like, and execute a program stored in the memory 202. The memory 202 includes a nonvolatile memory and a volatile memory, and forms a tester-side storage unit (a storage unit of the control board 200). Here, a part of the memory 202 may be incorporated in the one or more processors 201.

With respect to the above, the controller 22 of the test device 2 is a computer for controlling the entirety of the test device 2 including one or more processors 221, a memory 222, an input/output interface 223, and an electronic circuit 224. The one or more processors 221 are one of or a combination of two or more of a CPU, an ASIC, an FPGA, a circuit including multiple discrete semiconductors, and the like, and execute a program stored in the memory 222. The memory 222 includes a nonvolatile memory and a volatile memory, and forms a storage unit of the controller 22. Here, a part of the memory 222 may be incorporated in the one or more processors 221.

The controller 22 is connected to the aligner 242, the loader 243, the transfer stage 250, the tester 20, and the like via the input/output interface 223. For example, the controller 22 and each tester 20 are connected by wire via a communication line, which is not illustrated. Here, the controller 22 and each tester 20 may include communication modules that can be wirelessly connected to each other, and may transmit and receive information by wireless communication.

The controller 22 is connected to the operation terminal 23 provided in the housing 21 of the test device 2 via the input/output interface 223 (see FIG. 1). The operation terminal 23 includes a monitor 230, a keyboard 231, a mouse 232, and the like that constitute an input/output device 233 of the test device 2. Here, the configuration of the operation terminal 23 is not particularly limited, and a touch panel (not illustrated) or the like may be applied. The processor 221 of the controller 22 receives test content of the test device 2 that is input by the user via the operation terminal 23, outputs a control command to each component of the test device 2 based on the test content, and tests the semiconductor device of the wafer W. Additionally, when receiving the test result from each tester 20, the processor 221 stores the test result in the memory 222 and displays the test result via the operation terminal 23.

The above-described test device 2 extracts log information of the tester 20 itself for each of the multiple testers 20 during the operation of the test device 2. The "log information" of the tester 20 is information related to the state of the tester 20, which is different from the test result of the semiconductor device by the tester 20, and is stored in the memory 202 of the control board 200 in association with time information measured in the control board 200. The log information includes an event log, which is a record of an anomaly (a trouble, an operation error, or the like) or other events occurring in the tester 20, a diagnosis log, which is a record of self-diagnosis of the inside of the tester 20, a system log, which is a record of an operation (start, stop, or the like) of the tester 20, and the like.

For example, when the processor 201 of the control board 200 recognizes the occurrence of an anomaly in the tester 20 during the running of the tester 20, the processor 201 records a code corresponding to the anomaly. Additionally, for example, the processor 201 performs self-diagnosis in the tester 20 automatically or manually by a user, and records a result of the diagnosis (normal, failure, or the like). The processor 201 acquires the log information of the tester 20 over time and continues to accumulate (store) the acquired log information in the memory. Additionally, when receiving a request command for the log information, the processor 201 appropriately outputs the log information (including time information) accumulated in the memory 202 in response to the request command. When having output the log information, the processor 201 may delete the past output log information.

Further, the control board 200 retains tester-side identification information (hereinafter referred to as a tester-side ID 27) of the installed tester 20 itself in the memory 202. The tester-side ID 27 is unique information for each of the multiple testers 20, and is allocated in advance and stored in the memory 202 when the tester 20 (the test device 2) is shipped from a factory or the like. When receiving a request command for requesting the tester-side ID 27, the processor 201 transmits the retained tester-side ID 27.

The management device 3 includes one or more processors 31, a memory 32, an input/output interface 33, an electronic circuit 34, and the like, and is a computer that manages various devices in the processing chamber 10. The management device 3 includes an input/output device 38 such as a monitor 35, a keyboard 36, and a mouse 37 connected via an input/output interface 33. Here, in the processing system 1, the controller 22 or the operation terminal 23 of the test device 2 may have the same function as the management device 3.

The one or more processors 31 are one of or a combination of two or more of a CPU, a GPU, an ASIC, an FPGA, a circuit including multiple discrete semiconductors, and the like, and execute a program stored in the memory 32. The memory 32 includes a nonvolatile memory and a volatile memory, and forms a storage unit of the management device 3. Here, a part of the memory 32 may be incorporated in one or more processors 31.

The management device 3 may be, for example, a laptop computer, and may be mounted on a movable carriage (not illustrated) and movable in the processing chamber 10 under the operation of a user. In this case, after moving to the vicinity of the test device 2, the management device 3 becomes capable of performing information communication with each tester 20 in the test device 2 based on connection work to the test device 2 by the user. Here, the management device 3 may be connected to the test device 2 to be always communicable.

A configuration, in which the processing system 1 includes a hub 28 directly connected to each tester 20 of the test device 2 by wire (not via the controller 22), and a communication line connected to the management device 3 is connected to the hub 28 in connection work, can be adopted. Additionally, for example, the processing system 1 may be configured to communicate with each tester 20 via the controller 22 by connecting the management device 3 to the controller 22 by wire (a communication line) in connection work. Alternatively, the management device 3 may transmit and receive information to and from each tester 20 by wireless communication.

The management device 3 collectively acquires the log information stored in one or more target testers 20 among the multiple testers 20 of the test device 2 to which the management device 3 is connected, based on the log acquisition operation of the user. For example, in the log acquisition operation, the user first executes a log acquisition program (an application: not illustrated) stored in the memory 32 of the management device 3. By executing the log acquisition program, the processor 31 internally forms a functional block for log acquisition.

Figure 5:
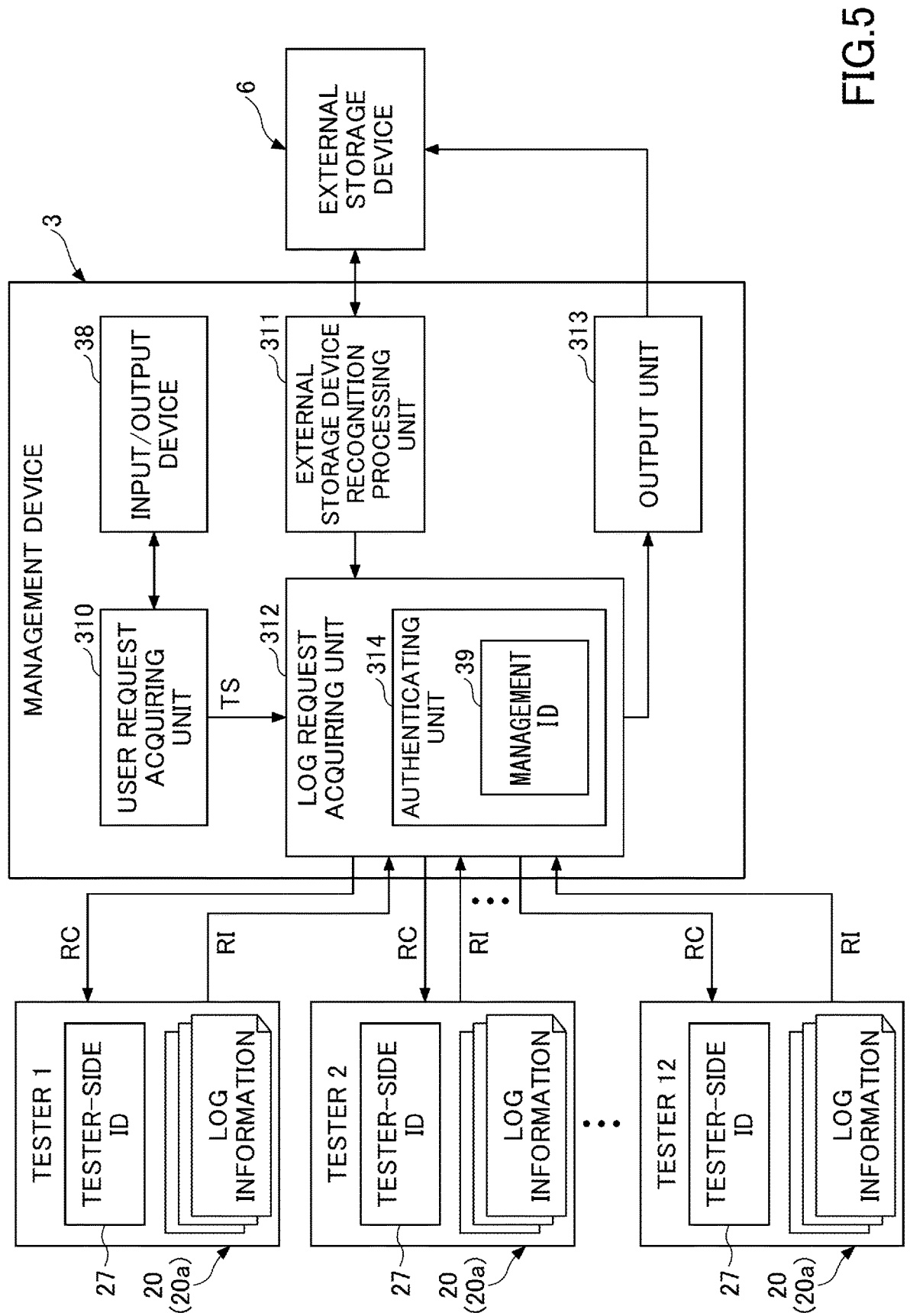
FIG. 5 is a functional block diagram for acquiring a log formed in a management device.

FIG. 5 is a functional block diagram for log acquisition formed in the management device 3. As illustrated in FIG. 5, a user request acquiring unit 310, an external storage device recognition processing unit 311, a log request acquiring unit 312, and an output unit 313 are formed inside the management device 3.

The user request acquiring unit 310 is a functional unit that receives, from the user, information indicating the acquisition of the log information of each tester 20. The user request acquiring unit 310 displays operation screen information 5 (GUI: Graphical User Interface, see FIG. 6), which is a user interface for the operation of the user, on the input/output device 38 based on the start of the log acquisition program. Based on the user performing a log acquisition operation on the operation screen information 5, the user request acquiring unit 310 outputs a trigger signal TS to the log request acquiring unit 312.

Figure 6:
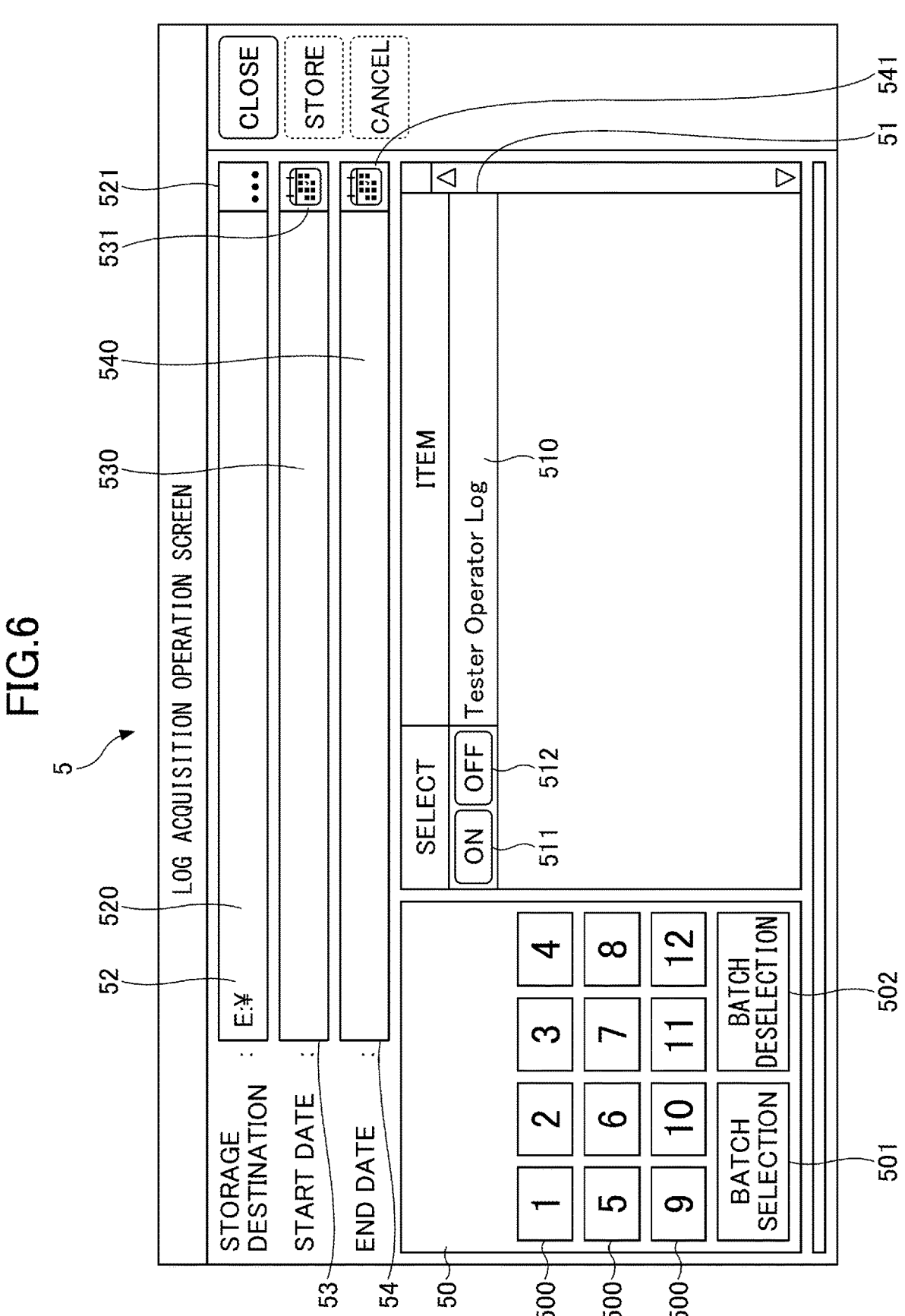
FIG. 6 is an explanatory diagram illustrating an example of operation screen information.

FIG. 6 is an explanatory diagram illustrating an example of the operation screen information 5. As illustrated in FIG. 6, the operation screen information 5 includes a tester selection image 50, a log type selection image 51, a storage location setting image 52, a start setting image 53, an end setting image 54, and the like.

The tester selection image 50 is display information for selecting multiple testers 20, and tester buttons 500 representing the individual testers 20 corresponding to the multiple testers 20 included in the test device 2 are arranged in a matrix of four rows and three columns. Additionally, the tester selection image 50 includes a batch selection button 501 for collectively selecting all the testers 20 of the test device 2 and a batch deselection button 502 for collectively deselecting the selected testers 20. The tester button 500, the batch selection button 501, and the batch deselection button 502 can be changed to a color different from the color displayed before the selection by a user's selection operation (a mouse click or the like) to allow the user to recognize what selection has been made.

Additionally, the user request acquiring unit 310 may be configured to automatically acquire information on the number and arrangement of the testers 20 (or a model number or the like of the test device 2) from the test device 2 and automatically generate the number and arrangement of the tester buttons 500 when the management device 3 is connected to the test device 2 by the connection work. Alternatively, before the operation screen information 5 of FIG. 6 is displayed, the user request acquiring unit 310 may set the number and arrangement of the tester buttons 500 according to the model number by the user inputting the model number or the like of the test device 2.

The log type selection image 51 is arranged at a position adjacent to the tester selection image 50 and allows the user to select a type of the log information (an event log, a diagnosis log, or a system log) (FIG. 6 illustrates a state in which a tester operation log for acquiring all types of log information is displayed) For example, the log type selection image 51 includes a log information type 510, and an on button 511 and an off button 512 at positions adjacent to the log information type. Only one of the on button 511 and the off button 512 can be selected, and is changed to a color different from the color displayed before the selection by a user's selection operation (a mouse click or the like) to allow the user to recognize what selection has been made.

The storage location setting image 52 is arranged above or below the tester selection image 50 and the log type selection image 51, and allows the user to set a storage location of the log information. The management device 3 automatically generates a directory (a folder) in the storage location designated by the user via the storage location setting image 52, and stores the log information in the directory. For example, the storage location setting image 52 may include a storage location selection button 521 that displays a location (including a hierarchy) of the directory and allows the user to select the location, together with an input field 520 that allows the user to perform keyboard input.

As illustrated in FIG. 4 and FIG. 5, the storage location of the log information is preferably a storage area of an external storage device 6 (the storage device such as a USB memory). As an example, at the time of log acquisition, the user request acquiring unit 310 performs displaying on the operation screen information 5 to prompt the user to connect the external storage device 6 to the management device 3. When recognizing the connection of the external storage device 6 to the management device 3, the external storage device recognition processing unit 311 outputs connection completion information to the user request acquiring unit 310. This allows the user request acquiring unit 310 to automatically set the storage location of the log information to the external storage device 6. Additionally, the management device 3 may store the log information only in the external storage device 6 designated in advance by authenticating identification information of the external storage device 6. This allows the processing system 1 to prevent the log information from being stored in a storage medium that is not designated, thereby improving the security.

Here, the storage location of the log information may be the memory 32 of the management device 3 or may be a memory 42 (see FIG. 4) of the information processing terminal 4 as will be described later. In this case, with respect to the security of the log information, it is only necessary to authenticate identification information of the user at the time of login to the management device 3 or the information processing terminal 4, so that only a specific user cannot acquire the log information.

Referring back to FIG. 6, the start setting image 53 is arranged below the storage location setting image 52 and allows the user to set the acquisition start time (start date) of the log information. Similarly, the end setting image 54 is arranged below the start setting image 53 and allows the user to set the acquisition end time (end date) of the log information. It is preferable that the start setting image 53 and the end setting image 54 include input fields 530 and 540 for allowing the user to perform keyboard input, and calendar selection buttons 531 and 541 for displaying a calendar in which dates are described and allowing the user to select a date on the calendar. The acquisition start time and the acquisition end time are not limited to a setting in days, and may be set in hours, minutes, or the like.

Based on the log information acquisition condition set by the user on the operation screen information 5 described above, the user request acquiring unit 310 generates a trigger signal TS as illustrated in FIG. 5 and outputs the trigger signal TS to the log request acquiring unit 312. That is, the trigger signal TS includes the tester 20 selected by the user (hereinafter referred to as a selected tester 20a), the type of the log information, the storage location of the log information, and the acquisition period (the acquisition start time and the acquisition end time) of the log information.

The log request acquiring unit 312 of the management device 3 stores the IP addresses of all the testers 20 of the test device 2 in advance, and generates a request command RC to be transmitted to the selected tester 20a when receiving the trigger signal TS from the user request acquiring unit 310. Then, the log request acquiring unit 312 collectively outputs the generated request command RC to respective selected testers 20a from which the log information is acquired. Here, "collectively" in the present disclosure indicates transmitting (outputting) to multiple selected testers 20a without requiring a user to perform a particular operation, and includes a concept of sequentially transmitting commands to multiple selected testers 20a in addition to simultaneously transmitting commands to multiple selected testers 20a.

Then, the log request acquiring unit 312 of the management device 3 transmits and receives information to and from the selected tester 20a from which the log information is acquired, multiple times. Specifically, the log request acquiring unit 312 generates, as a first request command RC, a first request command including the IP address of the selected tester 20a and a code for requesting the tester-side ID 27 from the selected tester 20a. Upon receiving the first request command, the processor 201 of the selected tester 20a reads the tester-side ID 27 stored in the memory 202, and returns response information RI (first response information) including the tester-side ID 27 to the management device 3.

After the log request acquiring unit 312 receives the first response information, an authenticating unit 314 in the log request acquiring unit 312 authenticates the tester-side ID 27. The memory 32 of the management device 3 retains, in advance, management identification information (hereinafter referred to as management ID 39) for each of the multiple testers 20 included in the test device 2. For example, the processing system 1 is configured such that the management device 3 is connected to the test device 2 at the time of startup when the test device 2 is initially installed in the processing chamber 10, and the IP addresses and the tester-side IDs 27 of all the testers 20 of the test device 2 are stored in the management device 3. Alternatively, the management device 3 may acquire the IP addresses and the tester-side IDs 27 of the testers 20 of the installed test device 2 by information communication with the manufacturer of the test device 2 after the installation of the test device 2 or the like.

The authenticating unit 314 reads the management ID 39 corresponding to the selected tester 20a from the memory based on the trigger signal TS of the user request acquiring unit 310, and automatically starts authentication of the selected tester 20a upon receiving the first response information. At this time, the authenticating unit 314 determines whether the tester-side ID 27 of the selected tester 20a and the retained management ID 39 match. When the tester-side ID 27 matches the management ID 39, the authenticating unit 314 determines that the authentication of the selected tester 20a is established. When the tester-side ID 27 does not match the management ID 39, it is determined that the authentication of the selected tester 20a is not established.

When it is determined that the authentication is established, the log request acquiring unit 312 outputs a second request command RC (a second request command) to the selected tester 20*a*. The second request command is actual request information for actually acquiring the log information of the selected tester 20*a*, and includes the IP address of the selected tester 20*a*, information indicating that the authentication has been established, and a code for acquiring the log information (including the type of the log information and the acquisition period). When recognizing the information indicating that the authentication has been established, the processor 201 of the selected tester 20*a* extracts the log information of the type and the acquisition period corresponding to the code from the log information stored in the memory 202, generates response information RI (second response information), and transmits the second response information to the management device 3. When it is determined that the authentication is not established, the log request acquiring unit 312 disables log acquisition of the selected tester 20*a*. At this time, the log request acquiring unit 312 preferably notifies the user of information indicating that the selected tester 20*a* is not a tester 20 from which log the information can be acquired via the monitor 35 or the like.

When the log information of the selected tester 20*a* is acquired, the log request acquiring unit 312 outputs a third request command RC (a third request command) to the selected tester 20*a* from which the log information is acquired. The third request command is log information acquisition end information including the IP address of the selected tester 20*a* and an abort code for ending the acquisition of the log information. Upon receiving the third request command, the processor 201 of the selected tester 20*a* ends the information communication with the management device 3, thereby restricting more than necessary transmission and reception of information.

Here, the authenticating unit 314 may be formed inside the processor 201 of the tester 20. In this case, the management device 3 transmits the first request command including the management ID 39 of the selected tester 20*a* to the selected tester 20*a*, the processor 201 performs authentication upon receiving the first request command, and returns an authentication result (authentication success or authentication failure) to the management device 3 as the first response information. This allows the management device 3 to output the second request command to the selected tester 20*a* in the same manner as described above when the authentication is established. When the authentication is not established, the processor 201 of the selected tester 20*a* can surely disable the transmission of the log information to the management device 3.

Upon receiving the log information of the selected tester 20*a* that is acquired by the log request acquiring unit 312, the log request acquiring unit 312 of the management device 3 stores the log information in the memory 32 of the management device 3. At this time, the log request acquiring unit 312 may generate a tester directory for each selected tester 20*a*, and further generate a type directory for each type of the log information in a lower layer of the tester directory. Alternatively, the log request acquiring unit 312 may generate a type directory in an upper layer and a tester directory in a lower layer.

Additionally, when the storage location set by the user in the user request acquiring unit 310 is set to the external storage device 6 (other than the memory 32 of the management device 3), the output unit 313 of the management device 3 stores the log information in the external storage device 6. Upon the management device 3 receiving the log information, the output unit 313 may delete the log information stored in the memory 32 so as not to leave the log information in the management device 3. Here, when the log information is stored in the external storage device 6, the management device 3 may directly store the log information in the external storage device 6 without temporarily storing the log information in the memory 32 of the management device 3.

It is preferable that the external storage device recognition processing unit 311 monitors whether the output of the log information to the external storage device 6 from the output unit 313 is completed, and automatically disconnects the information communication between the management device 3 and the external storage device 6 when the storage of the log information in the external storage device 6 is completed. That is, the external storage device recognition processing unit 311 releases the connection so that the external storage device 6 can be removed from the management device 3. This allows the processing system 1 to safely and stably store the log information in the external storage device 6.

Further, when the user performs a display operation of the log information, the output unit 313 outputs the log information to the monitor 35. For example, the output unit 313 may generate screen information (not illustrated) in which the log information and the time information associated with the log information are described in parallel for each selected tester 20*a* and display the screen information on the monitor 35.

Figure 7:
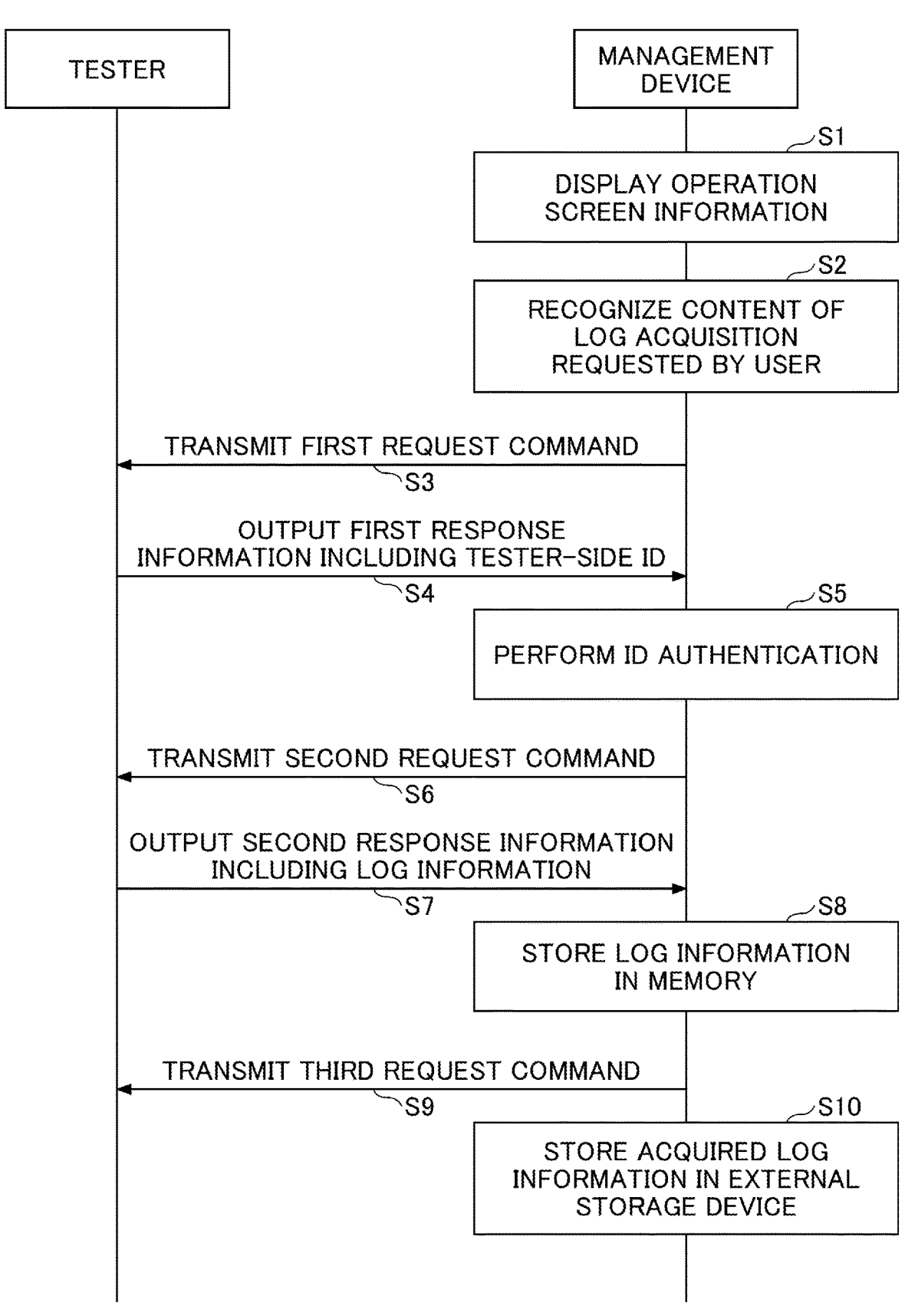
FIG. 7 is a flowchart illustrating a processing flow of the test device and the management device.

The processing system 1 and the management device 3 according to the present embodiment are basically configured as described above, and a processing flow of the log acquisition will be described below with reference to FIG. 7. FIG. 7 is a flowchart illustrating a processing flow of the test device 2 (the tester 20) and the management device 3.

In the management device 3, a log acquisition program is started by a user's operation. Then, after the start, the user request acquiring unit 310 of the management device 3 displays the operation screen information 5 as illustrated in FIG. 7 (step S1). The user operates the input/output device 38 based on the operation screen information 5 to set the selection of the tester 20 of the test device 2, the type of log information, the storage location of the log information, and the acquisition period of the log information. When the log information is stored in the external storage device 6, the user connects the external storage device 6 to the management device 3.

Then, the user request acquiring unit 310 recognizes the content of the log acquisition requested by the user based on the information input to the operation screen information 5 (step S2), generates the trigger signal TS corresponding to the content of the log acquisition, and outputs the trigger signal TS to the log request acquiring unit 312.

The log request acquiring unit 312 of the management device 3 generates the request command RC based on the trigger signal TS and transmits the request command RC to each of the one or more selected testers 20*a*. First, the log request acquiring unit 312 transmits the first request command including the IP address and the code for requesting the tester-side ID 27 to the selected tester 20*a* (step S3). The tester 20 (selected tester 20*a*) that has received the first request command outputs the first response information including the tester-side ID 27 to the management device 3 (step S4).

When the log request acquiring unit 312 receives the first response information, the authenticating unit 314 performs ID authentication to determine whether the tester-side ID 27 matches the management ID 39 (step S5).

If the tester-side ID 27 does not match the management ID 39, the management device 3 and the selected tester 20a disable the acquisition of the log information to the management device 3 (a log acquirement disabling step). If the tester-side ID 27 matches the management ID 39, the log request acquiring unit 312 transmits the second request command including the IP address, the information indicating that the authentication is established, and the code for requesting the log information to the selected tester 20a (step S6). The tester 20 that has received the second request command outputs the second response information including the log information to the management device 3 (step S7).

When receiving the second response information, the management device 3 extracts the log information included in the second response information by the log request acquiring unit 312 and temporarily stores the log information in the memory 32 (step S8). When the acquisition of the log information is completed, the log request acquiring unit 312 transmits the third request command including the IP address and the abort code to the selected tester 20a (step S9).

Further, when the external storage device 6 is connected to the management device 3 for the log acquisition, the output unit 313 of the management device 3 stores the acquired log information in the external storage device 6 (step S10), and does not leave the log information in the management device 3. According to the processing flow of the log acquisition described above, the processing system 1 can easily acquire the log information of the selected tester 20a of the test device 2 by the management device 3.

Here, a situation in which the user acquires log information for each tester 20 of the test device 2 is considered as a comparative example. In this case, the user performs a unit setting operation of inserting the external storage device 6 for acquiring the log information to each of the multiple selected testers 20a. In particular, in the test device 2 having a multi-stage structure (see FIG. 1 and FIG. 3) in which the multiple tester lines 260 are provided in the vertical direction, it is difficult to connect the external storage device 6 to the tester 20 located at a high position, which imposes a large workload on the user. Additionally, in the unit setting operation, because the user is highly likely to mistake the selected tester 20a to which the external storage device 6 is connected, the user is required to check whether the log information is acquired from the selected tester 20a. That is, in the unit setting operation, it is difficult to manage the log information.

With respect to the above, according to the processing system 1 and the management device 3 of the present embodiment, the unit setting operation of connecting the external storage device 6 to the tester 20 is removed. Therefore, the processing system 1 can reduce the burden of the log acquisition on the user. Additionally, because the management device 3 requests the selected tester 20a for the log information at one time, the user is less likely to mistake the target tester 20, and the log information can be managed safely and easily. In particular, the management device 3 can further facilitate the management of the log information by automatically storing the log information for each selected tester 20a or for each type of the log information.

Additionally, the processing system 1 is not limited to the configuration in which the log information of each tester 20 is acquired by the management device 3, and as illustrated in FIG. 1 and FIG. 4, the log information may be acquired by the information processing terminal 4 connected to the test device 2 or the management device 3 to be capable of performing information communication. The information processing terminal 4 is connected to the test device 2 or the management device 3 via a network 49 such as an intranet (a private network) or the Internet. In this case, the information processing terminal 4 provided outside the processing chamber 10 can be applied, and for example, the information processing terminal 4 of a maintenance worker, a manufacturer, or the like of the test device 2 can be used.

Similarly to the management device 3, the information processing terminal 4 includes one or more processors 41, a memory 42, an input/output interface 43, an electronic circuit 44, and the like, and also includes input/output devices 48, such as a monitor 45, a keyboard 46, a mouse 47, and the like connected via the input/output interface 43. By the processor 41 executing the log acquisition program dedicated to the information processing terminal 4 stored in the memory 42, the information processing terminal 4 can selectively acquire the log information of multiple testers 20 and appropriately manage the acquired log information.

When the information processing terminal 4 performs the log acquisition, the following patterns (a) and (b) are conceivable.

(a) The test device 2 and the information processing terminal 4 perform direct information communication.

(b) The test device 2 and the information processing terminal 4 perform information communication via the management device 3.

In the pattern (a), the information processing terminal 4 performs information communication with the test device 2 without the intervention of the management device 3, so that the information processing terminal 4 acquires the log information of the selected tester 20a set by the user on the information processing terminal 4. In this case, the information processing terminal 4 can adopt the above-described configuration of the management device 3 as it is. In other words, the processing system 1 can use a computer located apart from the processing chamber 10 as the management device 3.

In the pattern (b), the information processing terminal 4 performs information communication with the test device 2 via the management device 3, so that the information processing terminal 4 acquires the log information of the selected tester 20a set by the user on the information processing terminal 4. That is, in the pattern (b), the management device 3 serves as an FTP server for acquiring the log information, and the information processing terminal 4 serves as a client terminal for requesting and acquiring the log information.

Here, when the log acquisition is performed by the information processing terminal 4, it is preferable that the processing system 1 determines whether the information processing terminal 4 is a regular information processing terminal 4 that is permitted to transmit log information, when an access of the information processing terminal 4 to the test device 2 or the management device 3 is opened or the like. For example, the test device 2 or the management device 3 may be configured to request the information processing terminal 4 to input a predetermined password, and determine whether the information processing terminal 4 is the information processing terminal 4 that can access the test device 2 or the management device 3, when there is the access from the information processing terminal 4.

Additionally, in the pattern (b), the information processing terminal 4 may be configured to acquire the log information of the management device 3 in addition to the log information of the tester 20 of the test device 2. Examples of the log information of the management device 3 include an event log that is a record of an anomaly (a trouble, an operation error, or the like) or another event that has occurred in the management device 3, and a system log that is a record of an operation (start, stop, or the like) of the management device 3, and the like.

Figure 8:
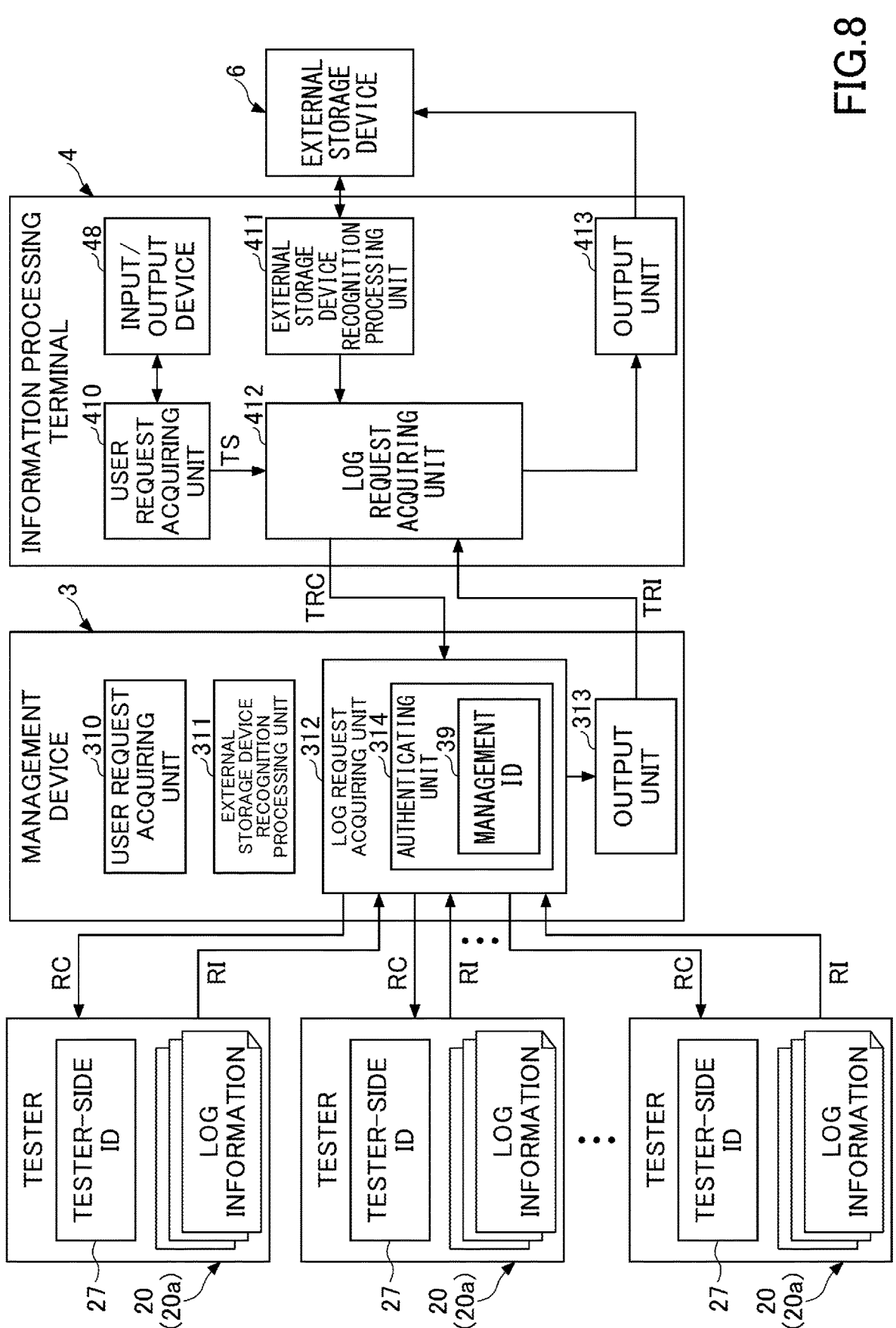
FIG. 8 is a block diagram illustrating transmission and reception of information between the test device and an information processing terminal via the management device.

FIG. 8 is a block diagram illustrating transmission and reception of information between the test device 2 and the information processing terminal 4 via the management device 3. When the execution of the log acquisition program dedicated to the information processing terminal 4 is operated, as illustrated in FIG. 8, the information processing terminal 4 internally forms a user request acquiring unit 410, an external storage device recognition processing unit 411, a log request acquiring unit 412, and an output unit 413. Among these functional units, the external storage device recognition processing unit 411, the log request acquiring unit 412, and the output unit 413 are substantially the same as the external storage device recognition processing unit 311, the log request acquiring unit 312, and the output unit 313 of the management device 3.

Figure 9:
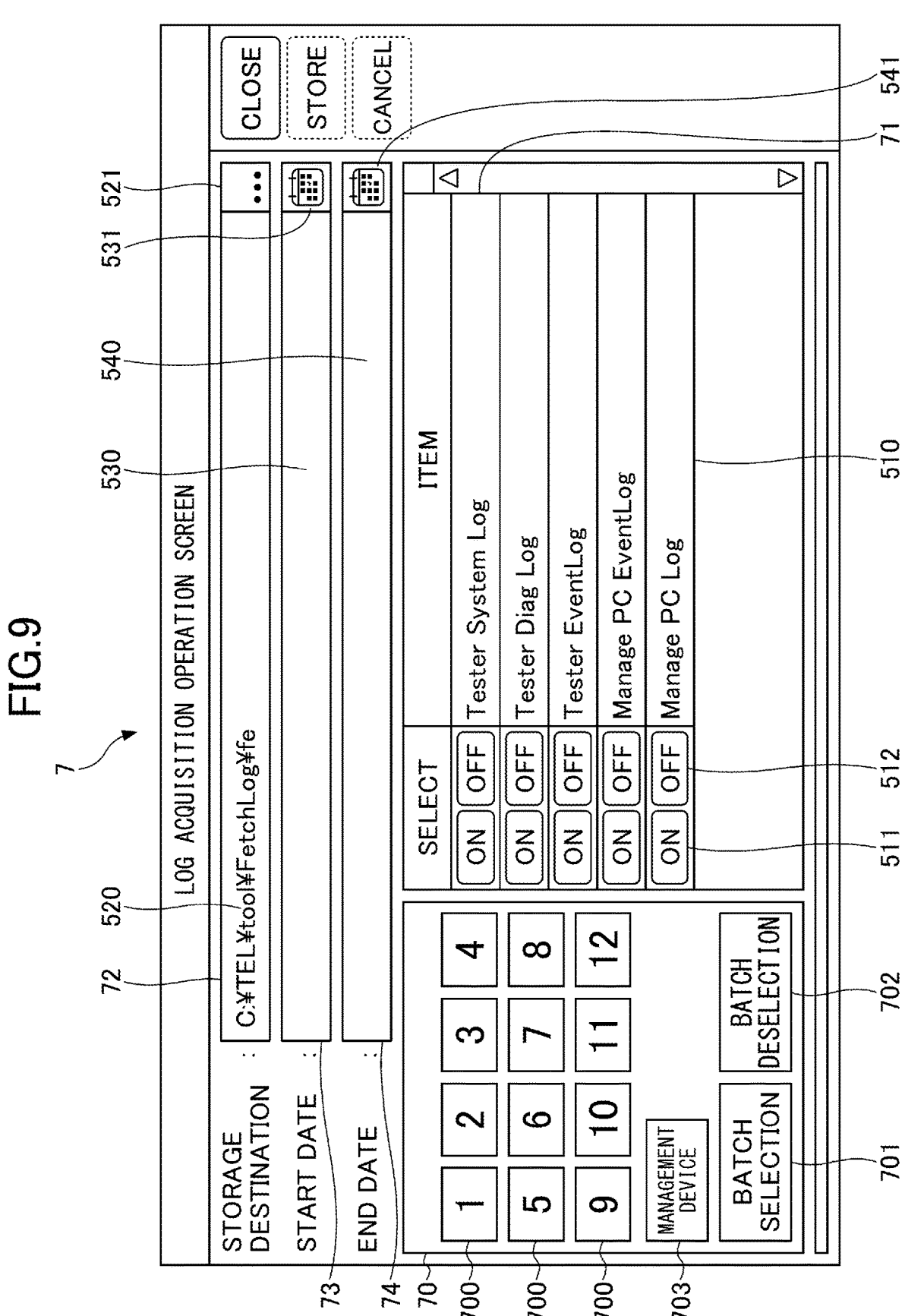
FIG. 9 is an explanatory diagram illustrating an example of information processing terminal-side operation screen information.

The user request acquiring unit 410 of the information processing terminal 4 displays information processing terminal-side operation screen information 7 on the monitor. FIG. 9 is an explanatory diagram illustrating an example of the information processing terminal-side operation screen information 7. As illustrated in FIG. 9, the information processing terminal-side operation screen information 7 includes a tester selection image 70, a log type selection image 71, a storage location setting image 72, a start setting image 73, an end setting image 74, and the like. In addition to the multiple testers 20 (tester buttons 700), a management device button 703 of the management device 3 is displayed in the tester selection image 70 as a target from which the log information is to be acquired. When the user operates a batch selection button 701, all the testers 20 and the management device 3 are collectively selected. Similarly, when the user operates the batch deselection button 702, the selection of all the testers 20 and the management device 3 is collectively canceled.

In addition to the type of the log information of the tester 20, the log type selection image 71 also displays options for the type of the log information (an event log and a system log) of the management device 3. Here, the storage location setting image 72, the start setting image 73, and the end setting image 74 are the same as the respective images of the operation screen information 5 of the management device 3.

As illustrated in FIG. 5 and FIG. 8, the user request acquiring unit 410 generates the trigger signal TS based on the log information acquisition condition set by the user in the information processing terminal-side operation screen information 7, and outputs the trigger signal TS to the log request acquiring unit 412. Upon receiving the trigger signal TS, the log request acquiring unit 412 of the information processing terminal 4 generates an information processing terminal-side request command TRC to be transmitted to the management device 3, and outputs it to the management device 3. The information processing terminal-side request command TRC includes the selected tester 20*a*, the type of the log information, the storage location of the log information, and the acquisition period (the acquisition start time and the acquisition end time) of the log information, selected by the user.

When receiving the information processing terminal-side request command TRC, the processor 31 of the management device 3 starts the log acquisition program and forms the log request acquiring unit 312, the log request acquiring unit 312, and the output unit 313 described above. At this time, the log request acquiring unit 312 generates a request command to be transmitted to the selected tester 20*a* based on the information of the information processing terminal-side request command TRC, and outputs the generated request command to each selected tester 20*a* from which the log information is acquired. That is, the management device 3 substitutes information communication between the test device 2 and the information processing terminal 4 by generating the request command RC using the information processing terminal-side request command TRC instead of the trigger signal TS of the user request acquiring unit 310.

The log acquisition operation of the selected tester 20*a* by the log request acquiring unit 312 is identical to the processing flow from steps S3 to S9 illustrated in FIG. 7, and a detailed description thereof will be omitted. Upon receiving the log information of the selected tester 20*a*, the log request acquiring unit 312 of the management device 3 stores the log information of the selected tester 20*a* in the memory of the management device 3.

Then, the output unit 313 of the management device 3 transmits information including the acquired log information of the selected tester 20*a* to the information processing terminal 4 as the management device-side response information TRI for the information processing terminal-side request command TRC. This causes the log request acquiring unit 412 of the information processing terminal 4 to acquire the log information of the selected tester 20*a* and stores the log information in the directory (PATH) set by the user. After transmitting the log information of the selected tester 20*a* to the information processing terminal 4, the management device 3 may delete the log information of the selected tester 20*a* in the management device 3 so that the log information is not left in the management device 3.

Additionally, for example, the information processing terminal 4 (the user request acquiring unit 410) may prompt the connection of the external storage device 6 to the information processing terminal 4 in the log acquisition. When the external storage device 6 is connected, the output unit 413 of the information processing terminal 4 stores the log information of the selected tester 20*a* in the external storage device 6. This can prevent the log information of the selected tester 20*a* from being left in the information processing terminal 4. Additionally, when the storing of the log information is completed, the external storage device recognition processing unit 411 may automatically disconnect the information communication between the information processing terminal 4 and the external storage device 6.

Here, in the log acquisition, the processing system 1 may be configured to generate a shared folder (not illustrated) for the log acquisition in either the management device 3 or the information processing terminal 4 and store the log information in the shared folder. The shared folder is a directory accessible from both the management device 3 side and the information processing terminal 4 side. For example, when the shared folder is generated in the information processing terminal 4, the processing system 1 stores the log information of the selected tester 20*a* only in the shared folder, and does not leave the log information in the other storage areas.

As described above, the processing system 1 can store the log information of the test device 2 to the information processing terminal 4 connected to the test device 2 or the management device 3. This allows the processing system 1 to more satisfactorily manage the state of the test device 2 that is remotely disposed, for example.

Second Embodiment

Next, a processing system 1A according to a second embodiment of the present disclosure will be described.

Figure 10:
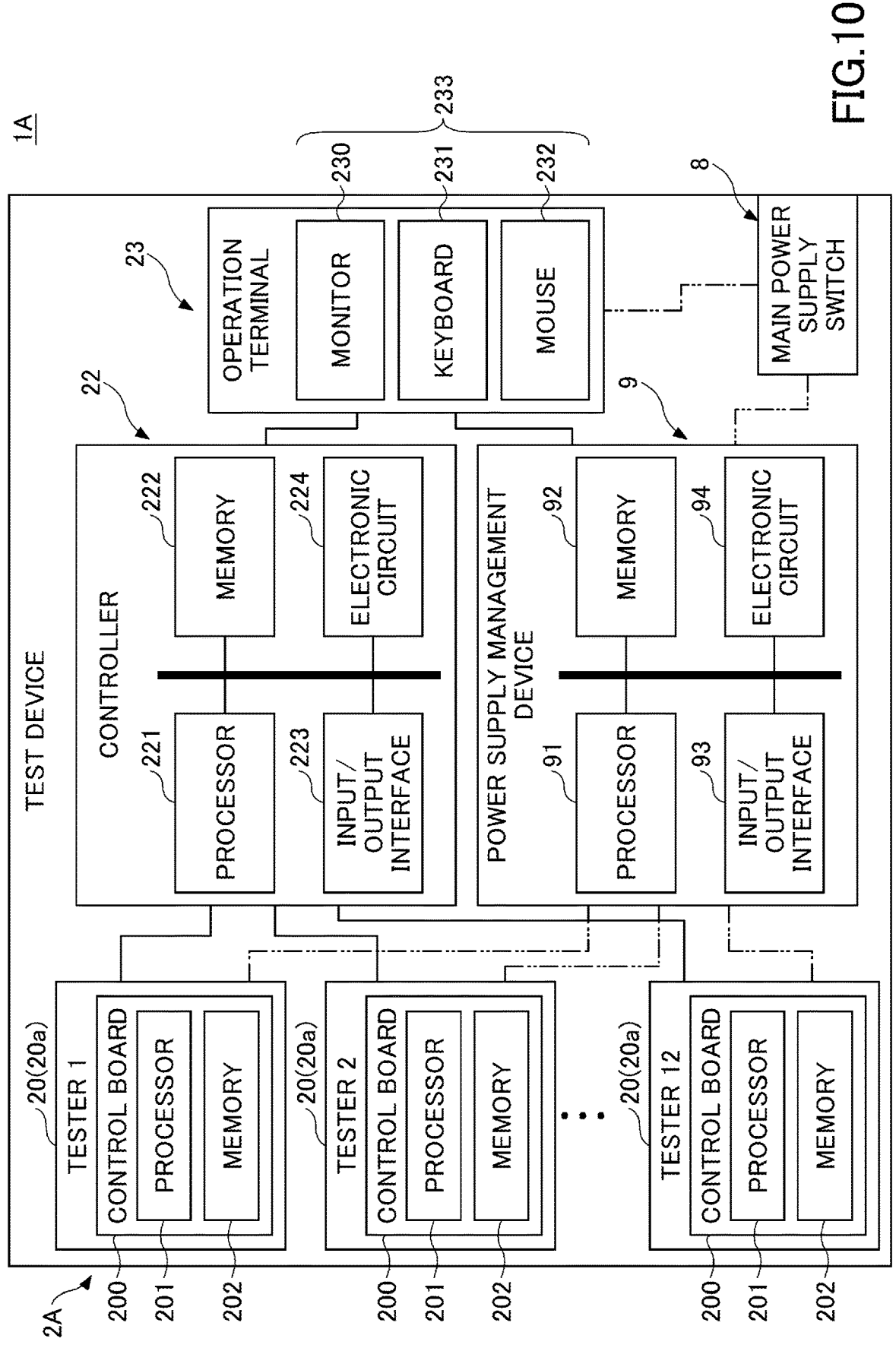
FIG. 10 is a schematic explanatory diagram illustrating an overall configuration of a processing system according to a second embodiment of the present disclosure.

FIG. 10 is a schematic explanatory diagram illustrating an overall configuration of the processing system 1A according to the second embodiment of the present disclosure.

As illustrated in FIG. 10, the processing system 1A operates powering on of each tester 20 of a test device 2A by the operation terminal 23 provided on an outer side surface of the housing 21 of the test device 2A. The processing system 1A may include the management device 3 or the information processing terminal 4 (see FIG. 4) connected to the test device 2A to be capable of performing information communication, and may be configured such that the management device 3 or the information processing terminal 4 operates powering on of each tester 20.

Specifically, similarly with the test device 2 of the first embodiment, the test device 2A has the test chamber 21a having the carry-in/out region 24, the transfer region 25, and the test region 26 (multiple testers 20), the controller 22, and the operation terminal 23. The test device 2A further includes a main power supply switch 8 and a power supply management device 9 that switches between on and off of the power supply of the tester 20.

The test device 2A is connected to an external power supply (not illustrated) via a harness, which is not illustrated, supplies power to the power supply management device 9 with the main power supply switch 8 being in an ON state, and cuts off power supply to the test device 2A with the main power supply switch 8 being in an OFF state. The main power supply switch 8 is a physical switch provided on an outer surface of the housing 21 (for example, the same outer surface as the outer surface of the operation terminal 23), and is manually switched between on and off by the user.

The power supply management device 9 is started by an ON operation of the main power supply switch 8, and is stopped by an OFF operation of the main power supply switch 8. Here, in addition to the main power supply switch 8, the test device 2A may include a physical switch that starts or stops the power supply management device 9. The power supply management device 9 is a computer including one or more processors 91, a memory 92, an input/output interface 93, an electronic circuit 94, and the like, and manages powering on and powering off of the multiple testers 20 of the test device 2A. The power supply management device 9 is connected to the operation terminal 23, and can notify the input/output device 233 (the monitor 230, the keyboard 231, the mouse 232, and the like) of the operation terminal 23 of information or receive input from the input/output device 233.

The power supply management device 9 is connected to all the testers 20 in the test device 2A via a communication line such as a LAN cable or a dedicated control line to be capable of performing information communication. Here, the power supply management device 9 may be configured to perform information communication with each tester 20 wirelessly.

Similarly with the tester 20 according to the first embodiment, each tester 20 of the test device 2A includes the control board 200 (the tester computer) and the test head (not illustrated) controlled by the control board 200. Each tester 20 can selectively power on and power off each of the control board 200 and the test head. Additionally, each tester 20 can switch between powering on and powering off manually by the user, and can switch between powering on and powering off under the command of the power supply management device 9.

Figure 11:
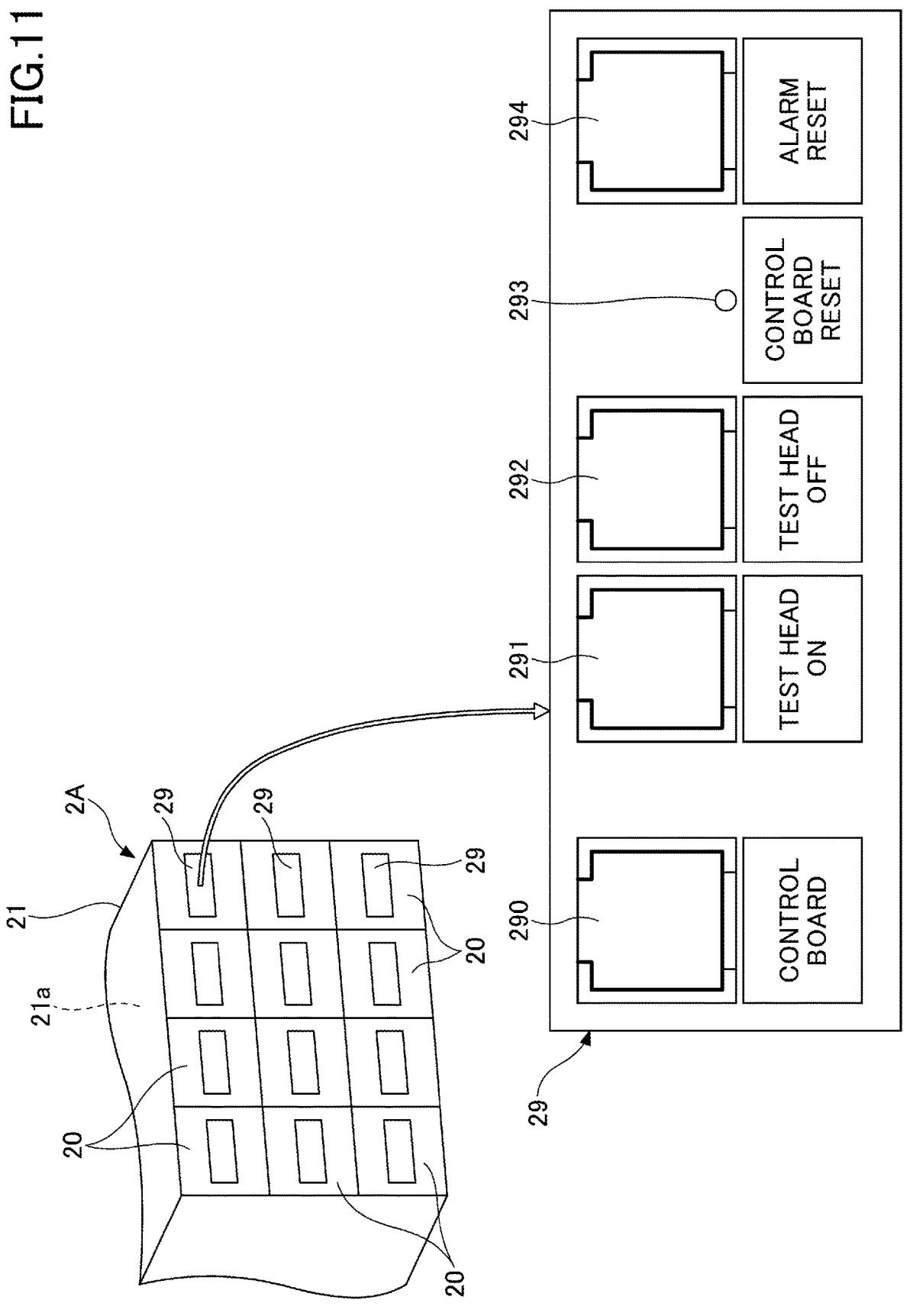
FIG. 11 is an explanatory diagram illustrating a switch panel of each tester.

FIG. 11 is an explanatory diagram illustrating a switch panel 29 of each tester 20. As illustrated in FIG. 11, each tester 20 includes the switch panel 29 for switching between powering on and powering off of the power supply on an outer surface (for example, a surface opposite to the surface on which the operation terminal 23 is installed) of the test device 2A. The switch panel 29 includes a control board switch 290, a test head on switch 291, a test head off switch 292, a control board reset switch 293, and an alarm reset switch 294. The control board switch 290 is a switch for switching between on and off of the power supply for the control board 200. The test head on switch 291 is a switch for turning on the power supply of the test head. The test head off switch 292 is a switch for turning off the power supply of the test head. The control board reset switch 293 is a switch for restarting the control board 200. The alarm reset switch 294 is a switch for stopping an alarm when the alarm of the tester 20 is notified. Unlike a hard switch (a physical switch), each switch is a soft switch displayed on the switch panel 29 on the outer surface of the test device 2A.

With respect to the above, the processor 91 of the power supply management device 9 displays power supply operation screen information 95 on the monitor 230 of the operation terminal 23 in an activated state of the power supply management device 9. Then, the processor 91 switches between powering on and powering off of each tester 20 (the control board 200 and the test head) in accordance with the user operation of the operation terminal 23 based on the power supply operation screen information 95.

Figure 12:
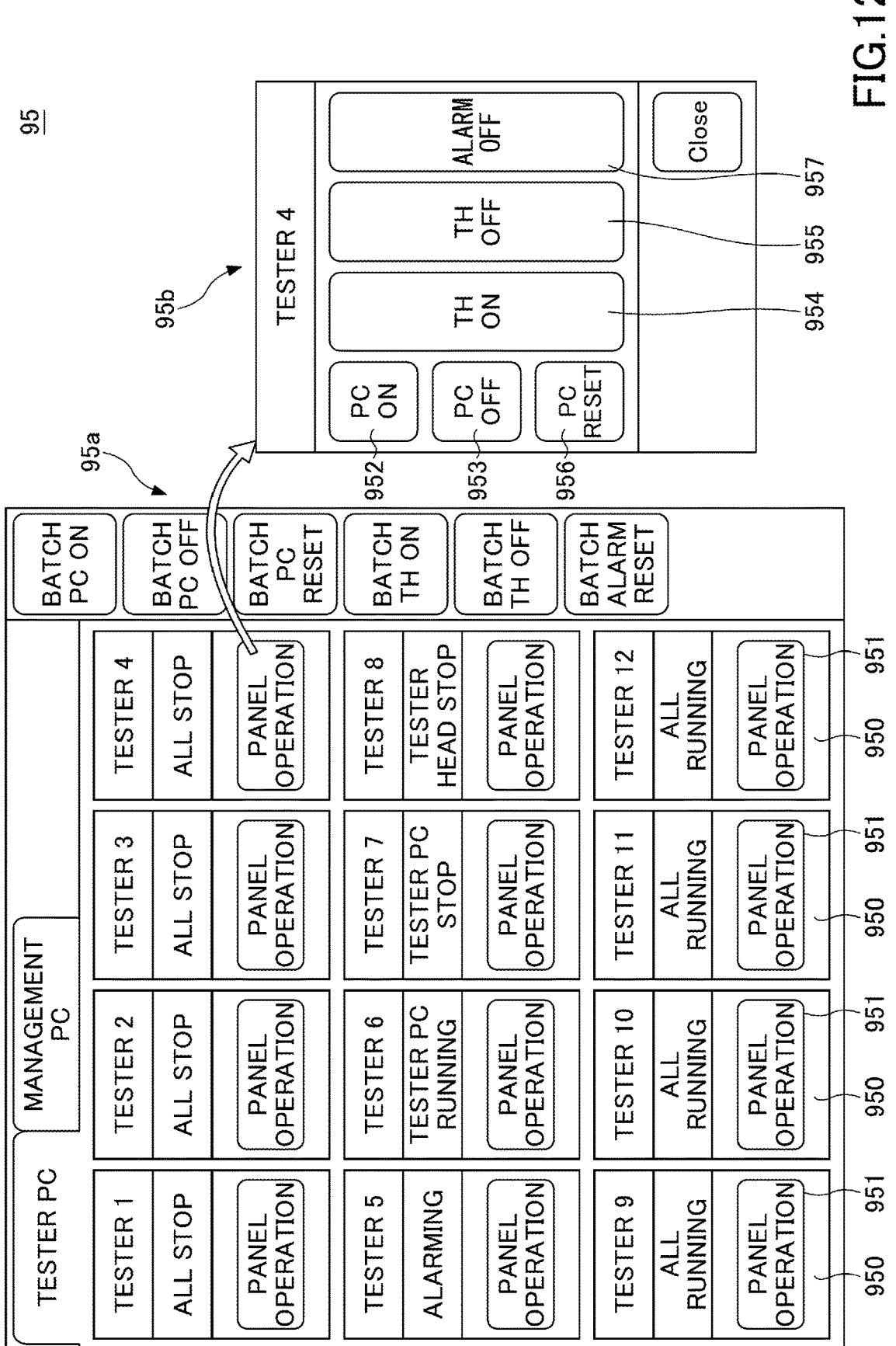
FIG. 12 is an explanatory diagram illustrating power supply operation screen information.

FIG. 12 is an explanatory diagram illustrating the power supply operation screen information 95. Here, in FIG. 12, the control board 200 is denoted by PC and the test head is denoted by TH. As illustrated in FIG. 12, the power supply operation screen information 95 displays power supply state image 950 of each tester 20 in the test device 2A as first screen information 95a, and displays display operation button image 951 for a second display on each of the multiple testers 20. The power supply state image 950 of each tester 20 displays the power-on state or the power-off state of the tester 20 by, for example, colors and characters. The display operation button image 951 displays a window for power supply operation of each tester 20, which is second screen information 95b, based on the user operation (a mouse click, a touch operation, or the like).

The second screen information 95b includes multiple soft switch displays operable on the monitor, similarly with the switches of the switch panel 29 described above. Specifically, there are a control board on switch display 952, a control board off switch display 953, a test head on switch display 954, a test head off switch display 955, a control board reset switch display 956, and an alarm reset switch display 957. That is, in the first screen information 95a, the user selects the tester 20 whose power supply is to be operated in accordance with the power supply state of each tester 20, and clicks the display operation button image 951 of the tester 20 (the selected tester 20a) Further, the user clicks the switch display of the second screen information 95b displayed by clicking the display operation button image 951.

When the processor 91 of the power supply management device 9 recognizes the above-described user operation, the processor 91 switches the power supply state of the selected tester 20a so as to match the content of the user operation. For example, when all the power supplies of the selected tester 20a are in the off state and the control board on switch display 952 is clicked by the user, the processor 91 powers on the control board 200 of the selected tester 20a and brings the control board 200 into the activated state. Additionally, when the test head on switch display 954 is clicked by the user, the processor 91 powers on the test head of the selected tester 20*a* to bring the test head into the activated state.

Alternatively, when all the power supplies of the selected tester 20*a* are in the on state and the test head off switch display 955 is clicked by the user, the processor 91 powers off the test head of the selected tester 20*a*. Further, when the control board off switch display 953 is clicked by the user, the processor 91 powers off the control board 200 of the selected tester 20*a*. Here, the tester 20 does not need to immediately cut off the power supply at the power off, and may shift to the off state after performing stop processing of the test head and stop processing of the control board 200, for example.

Additionally, it is preferable that the power supply management device 9 disables powering on of the test head in the power-off state of the control board 200. This allows the power supply management device 9 to power on the control board 200 and the test head in this order, and stably operate the tester 20. Furthermore, it is preferable that the power supply management device 9 disables powering off of the control board 200 in the power-on state of the test head. This allows the power supply management device 9 to power off the test head and the control board 200 in this order, and stably operate the tester 20.

The processing system 1A according to the second embodiment is basically configured as described above, and a processing flow of the powering on will be described below. FIG. 13 is a flowchart illustrating an example of an operating method of the power supply of the test device 2A.

When the test device 2A is operated, the user first performs an on operation on the main power supply switch 8 of the test device 2A (step S21). The on operation to the main power supply switch 8 starts the power supply management device 9 and the operation terminal 23 of the test device 2A (step S22).

After the startup, the processor 91 of the power supply management device 9 displays the power supply operation screen information 95 on the monitor 230 (step S23). With this the user of the test device 2A selects, on the monitor 230 of the operation terminal 23, the tester 20 to be powered on, and operates to power on the control board 200 or the test head of the selected tester 20*a* (step S24).

When recognizing the operation content of the powering on of the selected tester 20*a* by the user, the processor 91 of the power supply management device 9 powers on the control board 200 or the test head of the selected tester 20*a* in accordance with the operation content (step S25). In response to the control board 200 and the test head being powered on, the selected tester 20*a* automatically performs processing at the time of the startup and enters a state of being capable of testing the wafer W.

Here, the test device 2A not only may operate to power on and power off each of the multiple testers 20 as described above, but also may collectively power on and power off the control board 200 or the test head of the selected tester 20*a* (or all the testers 20). Alternatively, when collectively instructing to power on the selected tester 20*a* (or all the testers 20), the test device 2A may sequentially power on the control board 200 and power on the test head.

In the following, aspects and effects of the present disclosure will be described as a whole.

The processing system 1 or 1A according to one aspect of the present disclosure can maintain the security in log acquisition by authentication between the tester-side ID 27 and the management ID 39. Then, the processing system 1 or 1A can easily acquire the log information of the selected tester 20*a* by the management device 3, can suppress an error of the tester 20 acquiring the log information, and can easily manage the log information acquired from the multiple testers 20. Further, the processing system 1 or 1A does not need to perform a user manual operation of acquiring the log from the tester 20 provided at a high position in the height direction. Therefore, the user's workload can be greatly reduced.

Additionally, the multiple testers 20 are provided in the housing 21 of the test device 2A, the test device 2A includes the controller 22 that controls each of the multiple testers 20, and the management device 3 is connected to be capable of performing information communication with each of the multiple testers 20 without the intervention of the controller 22. This allows the processing system 1 or 1A to acquire the log information to the management device 3 without greatly affecting the information communication between the controller 22 and the tester 20.

Additionally, the management device 3 includes the user request acquiring unit 310 that displays the operation screen information 5 to cause the multiple testers 20 to be selected on the monitor 35 and selects the selected tester 20*a* from which the log information is acquired, based on the tester 20 selected by the user on the operation screen information 5. This allows the processing system 1 or 1A to further simplify the selection of the tester 20 by the user.

Additionally, the log information includes an event log, which is a record of an event occurring in the tester 20, a diagnosis log, which is a record of self-diagnosis of the inside of the tester 20, and a system log, which is a record of an operation of the tester 20. When selecting the selected tester 20*a*, the management device 3 can select the type of the log information and acquires the log information of the selected type. This allows the processing system 1 or 1A to suitably acquire the log information of the target type in the selected tester 20*a*, thereby further improving the workability of maintenance and the like.

Additionally, the management device 3 acquires the log information of the selected tester 20*a* based on the connection of the external storage device 6 configured to perform information communication with the management device 3, stores the acquired log information in the external storage device 6, and does not leave the log information in the management device 3. This allows the processing system 1 or 1A to store the log information of the selected tester 20*a* only in the external storage device 6 connected to the management device 3, and thereby improving the security.

Additionally, after storing the log information in the external storage device 6, the management device 3 automatically disconnects the information communication between the management device 3 and the external storage device 6. This allows the processing system 1 or 1A to smoothly and safely remove the external storage device 6 from the management device 3 after storing the log information in the external storage device 6.

Additionally, when the information processing terminal 4 that can perform information communication with the management device 3 is provided and a request for the log information is received from the information processing terminal 4, the management device 3 acquires the log information of the selected tester 20*a*, transmits the acquired log information to the information processing terminal 4, and does not leave the log information in the management device 3. This allows the processing system 1 or 1A to store the log information of the selected tester 20*a* in the information processing terminal 4 connected to the management device 3, thereby easily acquiring the log information even in a remote location.

Additionally, the information processing terminal 4 can acquire the log information of the management device 3 related to the state of the management device 3. This allows the user of the information processing terminal 4 to recognize the state of the management device 3.

Additionally, another embodiment of the present disclosure is the management device 3 connected to be capable of performing information communication with multiple testers 20 configured to test semiconductor devices, and includes the log request acquiring unit 312 configured to output the request command RC for requesting the log information related to the state of the tester 20, collectively to one or more selected testers 20a determined by selecting all the multiple testers 20 or some of the multiple testers 20 and acquire the log information from the selected tester 20a that receives the request command RC; and the authenticating unit 314 configured to determine whether the tester-side ID 27 of the selected tester 20a acquired based on the request command RC matches the management ID 39 of the selected tester 20a held in advance. When the authenticating unit 314 determines that the tester-side ID 27 matches the management ID 39, the acquisition of the log information is performed. When the authenticating unit 314 determines that the tester-side ID 27 does not match the management ID 39, the acquisition of the log information is disabled.

Additionally, another aspect of the present disclosure is a method of acquiring the log of the processing system 1 or 1A including multiple testers 20 configured to test semiconductor devices, and the management device 3 connected to be capable of performing information communication with the multiple testers 20. The multiple testers 20 are arranged in a height direction in two or more levels and each of the multiple testers 20 includes the memory 222 that stores the log information related to the state of the tester 20. The method including: a request step of outputting, from the management device 3, the request command RC for requesting the log information, collectively to one or more selected testers 20a determined by selecting all the multiple testers 20 or some of the multiple testers 20; an authentication step of determining whether the tester-side ID 27 of the selected tester 20a matches the management ID 39 of the selected tester 20a held by the management device 3 based on the request step; a log acquisition disabling step of disabling acquisition of the log information to the management device 3 when the tester-side ID 27 does not match the management ID 39 in the authentication step; and a log acquisition step of causing the management device 3 to acquire the log information from the selected tester 20a when it is determined that the tester-side ID 27 matches the management ID 39.

Also in the management device 3 and the log acquisition method described above, the log information of the selected tester 20 can be easily acquired and the workload of log acquisition can be reduced while maintaining the security.

The processing system 1 or 1A, the management device 3, and the log acquisition method according to the above-described embodiments are examples in all respects and are not restrictive. The embodiments can be modified and improved in various forms without departing from the scope and spirit of the appended claims. The matters described in the multiple embodiments can also take other configurations as long as there is no contradiction, and can be combined as long as there is no contradiction.

This application is based on and claims priority to Basic Application No. 2021-087885 filed on May 25, 2021 with the Japan Patent Office, the entire contents of which are incorporated herein by reference.

DESCRIPTION OF REFERENCE SYMBOLS

1, 1A processing system
2 test device
20 tester
202 memory
27 tester-side ID
3 management device
312 log request acquiring unit
313 output unit
314 authenticating unit
39 management ID
4 information processing terminal
5 operation screen information
6 external storage device

The invention claimed is:

1. A processing system comprising:
a plurality of testers configured to test a semiconductor device;
a management device connected to be capable of performing information communication with the plurality of testers,
wherein the plurality of testers are arranged in a height direction in two or more levels, and each of the plurality of testers includes a tester-side storage unit configured to store log information related to a state of the tester,
wherein the management device is configured to collectively output a request command for requesting the log information to one or more selected testers determined by selecting all of the plurality of testers or some of the plurality of testers, and acquires the log information from the selected tester that has received the request command,
wherein either the plurality of testers or the management device is configured to determine whether tester-side identification information included in the selected tester matches management identification information of the selected tester included in the management device, and
wherein the management device acquires the log information when the selected tester that has received the request command or the management device determines that the tester-side identification information matches the management identification information, and disables acquisition of the log information to the management device when the selected tester that has received the request command or of the management device determines that the tester-side identification information does not match the management identification information.

2. The processing system as claimed in claim 1,
wherein the plurality of testers are provided in a housing of a test device,
wherein the test device includes a controller configured to control each of the plurality of testers, and
wherein the management device is connected to be capable of performing the information communication with each of the plurality of testers without the intervention of the controller.

3. The processing system as claimed in claim 1, wherein the management device is configured to display, on an input/output device, operation screen information for causing the plurality of testers to be selected and selects the selected tester from which the log information is acquired, based on the tester selected by a user on the operation screen information.

4. The processing system as claimed in claim 3,
wherein the log information includes an event log, a diagnosis log, and a system log, the event log being a record of an event occurring in the tester, the diagnosis log being a record of self-diagnosis of an inside of the tester, and the system log being a record of an operation of the tester, and
wherein the management device is capable of selecting a type of the log information when selecting the selected tester, and acquires the log information of the selected type.

5. The processing system as claimed in claim 1, wherein the management device acquires the log information of the selected tester based on connection of an external storage device capable of performing information communication with the management device, stores the acquired log information in the external storage device, and does not leave the log information in the management device.

6. The processing system as claimed in claim 5, wherein the management device automatically disconnects the information communication between the management device and the external storage device after the log information is stored in the external storage device.

7. The processing system as claimed in claim 1, comprising an information processing terminal capable of performing information communication with the management device,
wherein when receiving a request for the log information from the information processing terminal, the management device acquires the log information of the selected tester, transmits the acquired log information to the information processing terminal, and does not leave the log information in the management device.

8. The processing system as claimed in claim 7, wherein the information processing terminal is capable of acquiring log information of the management device that is related to a state of the management device.

9. A management device connected to be capable of performing information communication with a plurality of testers, the plurality of testers being configured to test a semiconductor device, the management device comprising:
a processor; and a memory storing program instructions that cause the processor to:
collectively output a request command for requesting log information related to a state of the tester to one or more selected testers determined by selecting all the plurality of testers or some of the plurality of testers, and acquire the log information from the selected tester that has received the request command; and
determine whether tester-side identification information included in the selected tester that is acquired based on the request command matches management identification information of the selected tester held in advance,
wherein the management device acquires the log information in response to determining that the tester-side identification information matches the management identification information, and disables acquisition of the log information in response to determining that the tester-side identification information does not match the management identification information.

10. A log acquisition method of a processing system including a plurality of testers configured to test a semiconductor device, and a management device connected to be capable of performing information communication with the plurality of testers, the plurality of testers being arranged in a height direction in two or more levels, each of the plurality of testers including a tester-side storage unit configured to store log information related to a state of the tester, and the log acquisition method comprising:
collectively outputting, by the management device, a request command for requesting the log information to one or more selected testers determined by selecting all of the plurality of testers or some of the plurality of testers;
determining whether tester-side identification information included in the selected tester matches management identification information of the selected tester included in the management device;
disabling acquisition of the log information to the management device in response to determining that the tester-side identification information does not match the management identification information; and
causing the management device to acquire the log information from the selected tester in response to determining that the tester-side identification information matches the management identification information.

* * * * *